(12) United States Patent

Zens

(10) Patent No.: US 8,063,639 B2
(45) Date of Patent: Nov. 22, 2011

(54) DUAL-USE NMR PROBE

(75) Inventor: Albert P. Zens, Salinas, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 141 days.

(21) Appl. No.: 12/534,060

(22) Filed: Jul. 31, 2009

(65) Prior Publication Data

US 2011/0025326 A1  Feb. 3, 2011

(51) Int. Cl.
*G01V 3/00* (2006.01)
(52) U.S. Cl. .................................. 324/321; 324/322
(58) Field of Classification Search .................. 324/321, 324/322, 318
See application file for complete search history.

(56) References Cited

U.S. PATENT DOCUMENTS

| | | | |
|---|---|---|---|
| 5,466,480 A * | 11/1995 | Zhou et al. ....................... | 427/63 |
| 5,654,636 A | 8/1997 | Sweedler et al. | |
| 6,008,650 A | 12/1999 | Behbin | |
| 6,097,188 A | 8/2000 | Sweedler et al. | |
| 6,194,900 B1 * | 2/2001 | Freeman et al. .............. | 324/321 |
| 6,380,742 B1 | 4/2002 | Stringer et al. | |
| 6,396,274 B1 * | 5/2002 | Commens et al. ............ | 324/321 |
| 6,917,201 B2 | 7/2005 | de Swiet | |
| 7,271,592 B1 * | 9/2007 | Gerald et al. ................. | 324/321 |
| 7,405,567 B2 * | 7/2008 | McDowell .................... | 324/318 |
| 7,557,578 B1 | 7/2009 | Zens et al. | |

FOREIGN PATENT DOCUMENTS

| | | |
|---|---|---|
| JP | 07270510 | 10/1995 |
| WO | WO2005/103749 A1 | 11/2005 |
| WO | WO2007/020537 | 2/2007 |

OTHER PUBLICATIONS

Gary Martin, "Small-Volume and High-Sensitivity NMR Proves", Annual Reports on NMR Spectroscopy, vol. 56, pp. 2-88 (including title page), (2005).
Philip L. Kuhns, et al., "Inductive Coupling and Tuning in NMR Probes; Applications", J. Mag. Res., vol. 78, pp. 69-76 (1988).
M.D. Schnall, et al., "Wireless Implanted Magnetic Resonance Probes for in Vivo NMR", J. Mag. Res. vol. 68, pp. 161-167 (1986).
Joel Mispelter, et al., "NMR Probeheads for Biophysical and Biomedical Experiments", pp. 348-351 (Imperial College Press: London, 2006).
PCT International Search Report mailed Apr. 1, 2011 for International Application No. PCT/US2010/043775.

* cited by examiner

*Primary Examiner* — Louis Arana

(57) ABSTRACT

An NMR probe comprising an RF resonator 48 serves in a first mode for conventional sensitivity optimized studies of abundant samples at frequency $\omega_0$, and in a second mode for independent sensitivity optimized studies of micro sample quantities at frequency $\omega_0$ through use of a removably insertable self-resonant micro-coil 50 within the RF resonator 48 and closely surrounding a micro sample, that is preferably independently removably insertable within the micro-coil. The NMR probe exhibits an enhanced tuning range to resonate in its first mode and in the second mode to inductively couple to the self-resonant micro-coil 50 to induce self-resonance of the micro-coil 50 at $\omega_0$.

13 Claims, 5 Drawing Sheets

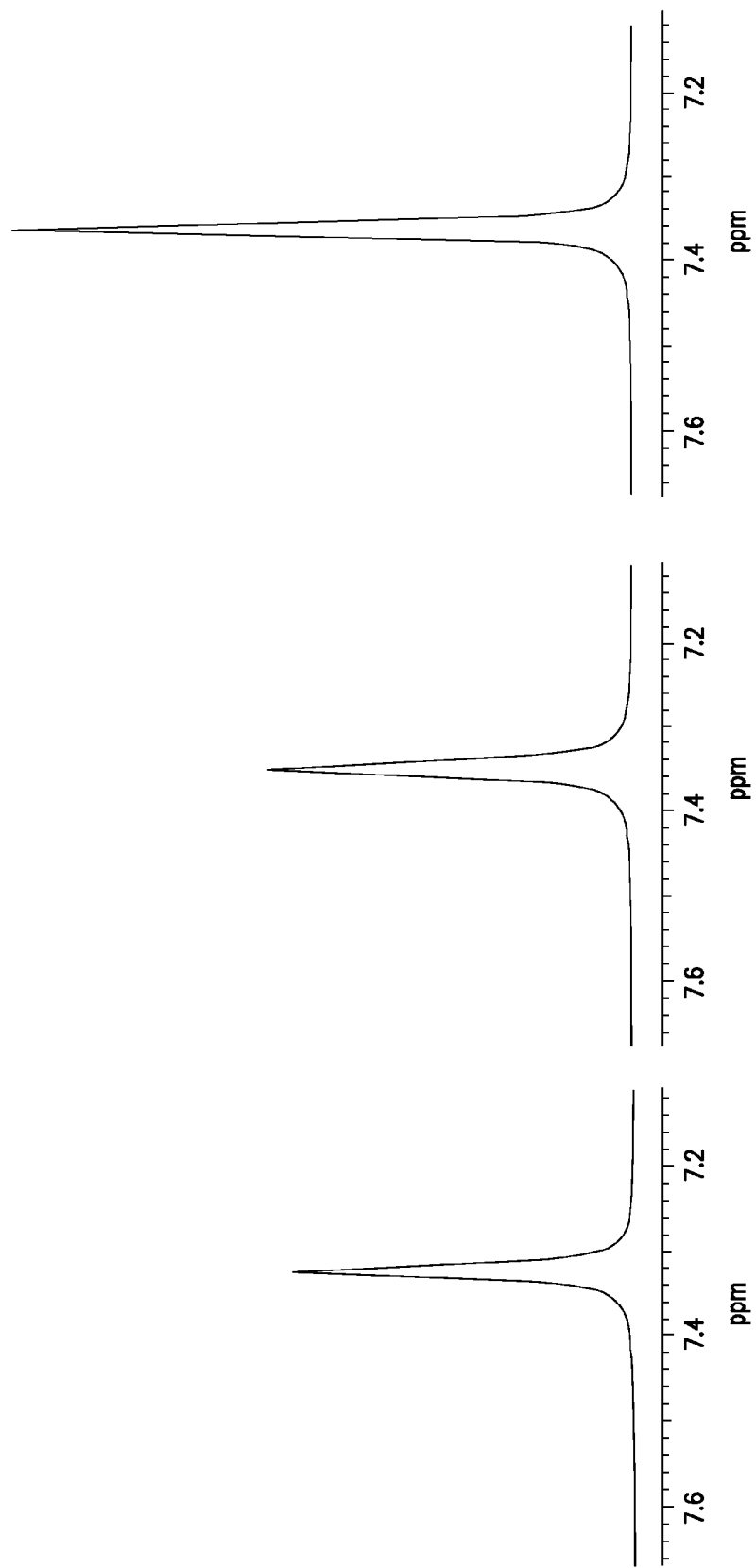

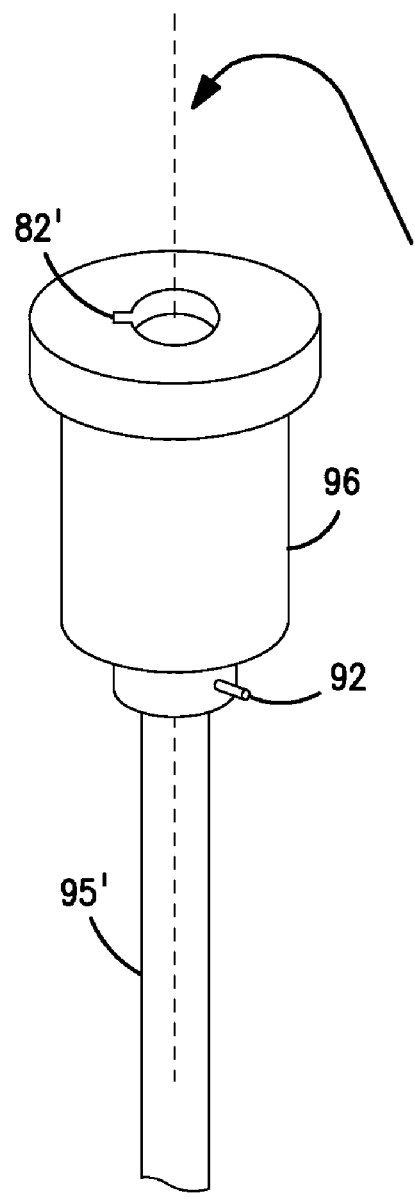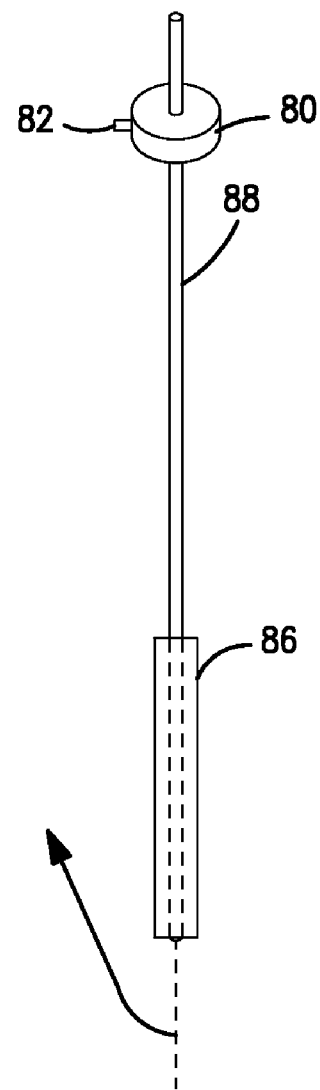
FIG. 4a
FIG. 4b

DUAL-USE NMR PROBE

FIELD OF THE INVENTION

This work pertains to nuclear magnetic resonance (NMR) measurement and particularly relates to NMR probe design and use.

BACKGROUND OF THE INVENTION

High resolution NMR studies are characterized by disposition of a sample on the axis of, and surrounded by the RF coil of the NMR probe at an axial position of excellent homogeneity of the polarizing field. A critical aspect of the apparatus is its sensitivity, which is a function of the properties of the RF coil, the temperature, and the geometric relationship of the sample to the interior space of the coil (filling factor). A quantitatively high signal amplitude requires a corresponding large quantity of sample, and thus a careful geometric match of sample to the RF coil, yielding a high filling factor, is desired. The filling factor is limited by the available transverse interior dimension of the RF coil. The aperture (RF window) of the coil determines the effective axial dimension of sample volume, but the physical volume of sample customarily extends beyond the coil aperture in accord with standard practice. Some transverse dimension is inevitably lost to the wall thickness of the sample container and any clearance between sample container and the RF coil, with the result that the volume of sample presented for study is always less than the (available) interior volume of the RF coil. So long as other factors effecting sensitivity have been optimized, maximum sensitivity is reached when the filling factor is maximized. Practical constraints limit maximum filling factor, optimum conditions for NMR studies are understood to include such practically achievable limits.

The modern NMR probe can accommodate a plurality of coaxial RF coils and each coil is a component of a resonant circuit which is tunable over a range of frequencies and adjustable in impedance match to the corresponding RF source/sink. A probe may further contain one or more preamplifier modules to condition received signals. Ambient temperature control of the sample and temperature monitoring components are typical features. Controlled high speed rotation of the sample container requires pressurized gas control for levitation of a sample turbine on air bearings, together with a separate pressurized gas control for turbine rotation and rotational rate detector. The RF coil (of either superconducting or normal conductor) may utilize temperature control. Consequently, an NMR probe is an expensive and complex instrument.

Although it is desirable for the quantity of sample to be "sufficient" for high quality NMR data, such sufficiency is a geometric parameter of the probe design. NMR practitioners have adopted certain standard sample container dimensions which accommodate typical conditions. For example, it is currently common for NMR studies to employ 5 mm o.d. sample tubes. Throughout this work the term "macro mode" refers to data acquisition from sample presented in such volume as available with 5 mm sample tubes (or the equivalent) in combination with an RF resonator exhibiting optimal filling factor for that sample. It may also be the case in some studies that some samples are characterized by unusually limited availability and it is known practice to utilize "micro coils" for these studies. Apart from the sample availability, enhanced sensitivity is achievable with micro samples closely matched to a micro-coil. The term "micro coil" is meant to convey a dimensional scale that is significantly smaller than the dimensions accommodating the standard sample. The contemporary standard analytic sample is presented to the probe in a 5 mm o.d. pyrex or quartz tube. The micro-coil is most often, a component of a purpose-built probe. It is conventional to present sample for "micro mode" studies in 3 mm. o.d. sample tubes where the micro-coil exhibits a high filling factor to such samples. For the purposes of this work, "micro mode" operations may be so defined in relation to macro studies. Redundancy in expensive probe apparatus to implement similar NMR studies of both plentiful sample and micro-samples is an expense that this work seeks to ameliorate.

The use of small volume samples in appropriately scaled NMR probes is reviewed at volume 56, Annual Reports on NMR Spectroscopy, pp. 2-88 (Academic Press, 2005) where the enhanced sensitivity for 3 mm. NMR studies is reviewed.

In prior art, the use of micro coils is well known and summarized in U.S. Pat. Nos. 5,654,636 and 6,097,188. It is also known to use a micro coil supported on a sample tube as a self-resonant circuit inductively coupled to the fixed RF coil of the NMR probe. See WO2007/020537. Dual use of the same probe for a variety of sample availabilities and requirements for the probe to obtain this benefit are not disclosed therein.

Inductively coupling in probe structure is well known. Representative of the art are: Kuhns, et al, J. Mag. Res., vol. 78, pp. 69-76 (1988); Schnall, et al, J. Mag. Res. Vol. 68, 161-167 (1986); and from the review by Mispelter, et al., NMR Probeheads for Biophysical and Biomedical Experiments, especially chapt. 3, (Imperial College Press: London, 2006).

SUMMARY OF THE INVENTION

In its standard, e.g., conventional operational mode (for macro samples, e.g., not limited in volume) the present NMR probe (comprising at least one RF resonator) may be unexceptional for studies at resonant frequency $\omega_0$. However, to accommodate inductive coupling to a micro-coil (for samples of substantially limited volume or to achieve enhanced sensitivity) for NMR studies at the same resonant frequency, $\omega_0$, such circuit must exhibit a tuning range rather more broad than typical of NMR probes. That is, the tuning range of the RF resonator circuit, inclusive of the RF coil, extends to include a frequency $\omega_c > \omega_0$ which depends upon the independent operating condition for inductive coupling to a micro-coil containing micro samples For operation in macro mode (plentiful sample presented in a sample container dimensioned for maximum filling factor with said RF resonator), tuning and matching the probe at $\omega_0$ proceeds in the usual manner. The same probe, inclusive of the same RF resonator without modification, may be utilized for examination of micro-samples with the sole addition of a coaxially inserted micro-coil (a much smaller diameter coil surrounding the much smaller sample/sample container. For this purpose the micro-coil comprises a self resonant circuit removable/insertable within the RF resonator. The conventional resonator of the probe assembly (typically a standard RF coil of the probe) inductively couples to the micro coil while the tuning of the standard probe circuit is increased to a frequency, $\omega_c$, such that the self resonant micro-coil circuit is resonant at $\omega_0$. It is important at this point to emphasize that there need be no relationship between the macro-volume and micro-volume samples. Nor is there any relationship between the classes of studies directed to these samples, other than the use of the same magnet for production of the polarizing field (e.g., $\omega_0$ for proton resonance or $\omega_0/4$ for $C^{13}$ resonances) and use of the same probe apparatus (same RF resonator) at optimum sensitivity for either type sample for studies at $\omega_0$. In this manner, the same NMR probe (with inexpensive micro-coil accessory) serves as a common platform for different experimental requirements.

BRIEF DESCRIPTION OF THE DRAWINGS

FIG. 2a is a spectrum of in a conventional 5 mm. sample tube within a "5 mm" RF coil.

FIG. 2b is a spectrum of the same sample as FIG. 2a in a 3 mm sample tube supported within a "5 mm" RF coil.

FIG. 2c is a spectrum of the 3 mm sample obtained with a micro coil inductively coupled to the "5 mm" coil.

FIG. 3c shows the mechanical structure detail of FIG. 3a.

FIG. 4a is a sample holder body for another embodiment.

FIG. 4b is the sample tube for the embodiment of FIG. 4a.

DETAILED DESCRIPTION OF THE INVENTION

In the following discussion of several embodiments, equivalent components bear the same identifier label. In this work, reference to "coil" and "resonator" will often be interchangeable for convenience.

Figure 1:
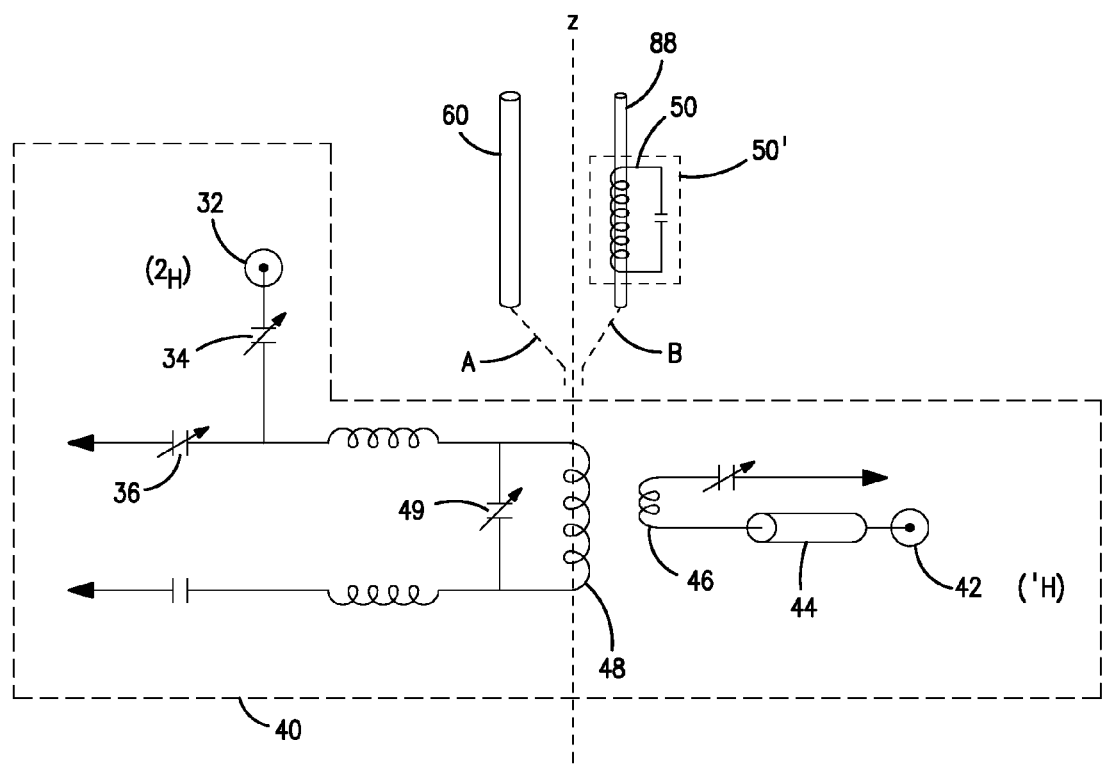
FIG. 1 is a representative probe circuit for this work, including a micro coil.

Central to this discussion is the employment of substantially the same NMR apparatus for studies of samples of widely different volume availability at optimal sensitivity independent of the sample volume. For the purposes of this work optimal sensitivity is achieved for probe performance when magnitudes of certain probe parameters, such as filling factor, Q value, temperature control and the like are close to practical limits for the particular probe. The probe circuit of FIG. 1 is merely representative of such circuits for the present work. A first RF port 42 communicates with the high frequency (usually proton) channel and is impedance matched thereto through a transmission line matching transformer 44 or the equivalent. Inductance 46 inductively couples to the resonant L-C circuit 48-49 from the RF source/sink, not shown. Capacitive coupling to the RF source/sink is alternatively appropriate. Coupling loop 46 is merely an example of coupling to the RF source/sink. (Capacitive coupling may be employed in the alternative). In conventional operation, the resonant circuit 48-49 is designed to exhibit resonance at $\omega_0$. A low frequency (here, deuterium) lock signal, is derived through a second RF port 32 with conventional tuning and matching via capacitors 34 and 36. The unlabeled inductances represent circuit leads. In macro mode operation, where sample volume is not severely limited, a sample tube 60 is employed, which itself fills the interior volume defined by the resonator coil 48. The sample substance fills the sample container to present maximum filling factor. For present purposes this conventional operation is schematically indicated by "A" in FIG. 1 and may be termed "macro mode" of operation and represents no more than the conventional intended use of the probe.

Figure 3A:
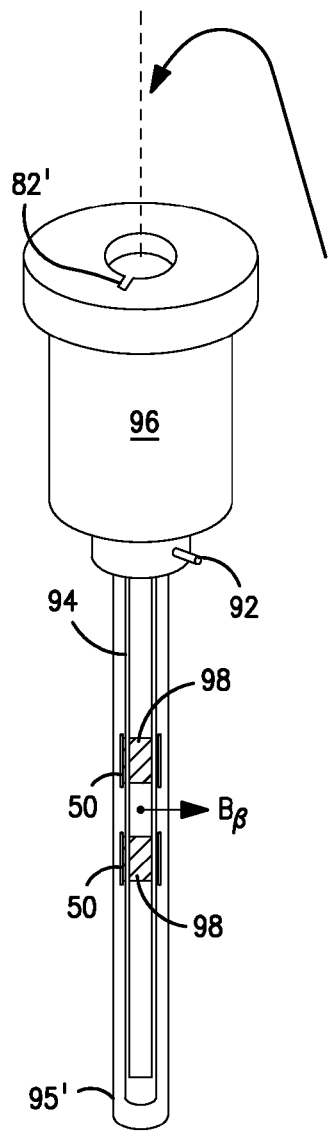
FIG. 3a shows a micro coil enabled sample holder.

The self resonant circuit 50' is capable of insertion within (and removal from) RF resonator 48 for use with a micro sample, shown schematically by "B" in FIG. 1 ("micro mode"). Resonator 48, together with supporting circuit and other probe instrumentalities, is disposed within the probe housing (not shown). Resonator 48 is most often an RF coil which may be realized in helical, or saddle coil, or Helmholtz or Alderman-Grant geometries, or as a resonant cavity. Self resonant circuit 50' comprises inductance in the form of micro-coil 50 of value $L_m$ surrounding the micro sample tube 88 and capacitance $C_m$ is furnished largely by the distributed capacitance of the structure of micro-coil 50 and RF shields 98 (FIG. 3a). The micro-coil 50 supported on one surface (interior or exterior) of coil former (not shown), which latter preferably comprises a thin quartz slip glass. Electrically floating RF shields 98 are typically disposed on the opposite surface of coil former and supply capacitance to terminals of micro-coil 50, thus forming self resonant circuit 50'. (For purposes of exposition, the micro-coil 50 is conveniently shown and discussed as providing RF magnetic field $B_\beta$ transverse to the axial dimension of the coil.) The circuit 50' is designed to be self-resonant at $\omega_0$. Additional capacitance may be supplied, if required, by a lumped component. In order for the micro-coil 50 to establish resonance at $\omega_0$ when coupled inductively to the standard probe circuit 40, the tuning range of the (representative) standard probe circuit 40 of FIG. 1, must have sufficient breadth to include the frequency $\omega_c > \omega_0$ when the micro-coil 50 is inserted. The incremental tuning range depends upon the mutual inductance of the coils 48 and 50 and the dynamic range of tuning capacitor 46. An NMR probe having sufficient breadth of tuning (for the same resonator 48) is not the subject of the present work, except as a necessary context of the present work.

The axis z should not be interpreted as other than a simple geometric axis of the resonator 48. It is understood that the direction of the RF magnetic field direction for resonator 48 may be along z for a solenoidal embodiment of resonator 48 or transverse to z for saddle coil/Alderman-Grant geometry. The orientation with respect to an external polarizing magnetic field is not to be implied from FIG. 1.

Coupling of the resonant circuit 48-49 to the RF source/sink at 50 ohms is achieved conventionally. In macro mode, the micro-coil 50 is absent and the probe circuit 48-49 is efficiently tuned and matched at $\omega_0$. In micro mode, the self resonant micro-coil circuit 50' inductively couples to the resonator 48 and the circuit 48-49 is re-tuned to $\omega_c$ and matched to support studies of the micro sample at $\omega_0$.

The parameter $(\omega_c - \omega_0)/\omega_0$ is typically larger than encountered in the typical NMR probe. NMR probes accommodating studies of both $^1H$ as well as $^{13}C$, for example, employ different corresponding RF coils for their respective purposes. It is not outside the state of the art to design the circuit 48-49 and supporting components to tune over the range required in the present work (to couple to micro coil 50 resonant at $\omega_0$) with acceptable match to 50 ohms. It is simply remarked that this is the context for the present work. The wide range tuning capability of the resonant circuit 48-49 can be effectuated in another suitable arrangement to accommodate a plurality of frequency-distant resonances using a selectably switchable array of reactances as demonstrated by WO 2005/103749 A1, commonly assigned with the assignee of the present work. Another embodiment of the present work includes such an arrangement wherein at least one of the plurality of switched resonant frequencies includes the micro mode frequency corresponding to a macro mode resonance.

The functional significance of the present work is illustrated in proton spectra as shown in FIGS. 2a, 2b, and 2c. For purpose of this comparison, the identical mass of the same sample is employed for acquisition of the three spectra at 500 MHz. These three spectra exhibit the same ordinate scale for direct comparison. In FIG. 2a (macro mode) a sample of adenosine (6 amino protons) in DMSO-d6) is presented for acquisition of a spectrum in a standard 5 mm. o.d. sample tube surrounded by an Alderman-Grant resonator 48 accommodating the standard volume sample tube with optimal filling factor. The RF aperture of the resonator 48 is 20 mm and the standard 5 mm sample tube is filled to an axial length of 55 mm. This sample constitutes about 138 μliters/cm (axial). In FIG. 2b, the macro mode experiment is repeated for the same sample, now utilizing a 3 mm (o.d) sample tube, presenting the same mass of sample for spectral acquisition. The 3 mm sample tube is filled to the same (axial) level as the sample of FIG. 2a. The nearly identical spectral response is as to be expected for the same mass quantity of sample disposed in the same homogeneous RF $B_1$ field.

In order to achieve enhanced sensitivity, the practitioner may wish to employ small volume samples and corresponding micro-coil. FIG. 2b represents a situation where such small volume is sample is studied, but without the benefit of the enhanced sensitivity obtained with a micro coil. It is remarked that in some instances the solvent may contain impurities that interfere with spectral analysis. By concentrating the sample in a smaller volume these impurities present a lesser hindrance to spectral analysis. For the present work, FIG. 2b is presented for comparison purposes only.

The present work serves diverse studies with a single NMR probe, augmented by the availability of a self resonant micro-coil 50 for use in the small volume mode. In FIG. 2c (micro sample mode), a self resonant micro-coil 50 is inserted coaxially within resonator 48 to couple to the same 3 mm sample tube as employed for FIG. 2b. The micro-coil 50 is of saddle geometry having an RF window length of 12 mm and aligned with the RF aperture of resonator 48. The same experiment is repeated again after tuning the standard probe circuit to a value $\omega_c > \omega_0$ in order to couple to the self resonant circuit 50' at $\omega_0$. It is apparent that the inductively coupled micro coil experiment of FIG. 2c yields significantly greater signal (within the smaller RF aperture) for the same mass of sample as observed in FIGS. 2a and 2b. These results confirm acquisition of optimal spectral data in both macro mode and micro mode at the same resonant frequency, using the same probe.

The pair of measurements at diverse sample volumes (FIGS. 2a and 2c) is representative of the dual use of the same NMR probe at the same nuclear resonant frequency for diverse sample volumes or enhanced sensitivity at optimal conditions. It is to be emphasized that the typical benefit of the present work is to provide a capability for NMR analyses of diverse sample quantities with the same probe apparatus, avoiding redundancy in the NMR probe apparatus necessitated only by volumetric considerations.

In the micro mode experiment, the resonant condition in the LC pair 48-49 was observed to occur at $\omega_c = 625$ MHz in order to drive the self resonant circuit 50' at 500 MHz. The standard tuning specification for the circuit allows about 30 MHz to the lower side of $\omega_0$ (a convenient range inclusive of the fluorine resonance). Thus, the circuit of FIG. 1 exhibits a dynamic tuning range of at least $\omega_0/(\omega_c - \omega_0) = 500/150$. It is noted that commercial probe design for high resolution NMR proceeds from two major considerations: the actual magnet field strength, and the nuclei for excitation/detection. For modern superconducting magnets, the range of field strength about a nominal design/quoted value is quite small. For example a nominal 500 MHz magnet is specified to present a field strength (measured by proton resonance frequency) in the range 495 to 505, MHz. Consequently, a probe designed for proton studies with a nominal 500 MHz magnet will have a tuning range of at least about 20 MHz to accommodate this tolerance. The other major consideration is quite often the frequency separation of two nuclei for which the probe operations are intended. That is quite typically (although not exclusively) $^1H$ and $^{19}F$, about a 30 MHz separation at 500 MHz.

Accordingly, a probe designer will build in a tuning range (while maintaining the impedance matching condition) of about 50 MHz for a $^1H$ and $^{19}F$ probe for a nominal 500 MHz spectrometer. A broader tuning range is not without precedent, but it is uncommon from the economics of the enterprise. Such unusually broad tuning capability is a necessary condition for the dual use benefit of the present work, as may be seen from an analysis of the circuit of FIG. 1. The extended frequency range for inductively coupled resonant tuning is discussed by Kuhns, et al, previously cited.

The required tuning range need not be assumed to be continuous. It is known to provide for multi-nuclear capability with switchable reactances to establish the desired tuning range centered upon respective discrete resonant frequencies. An example is the Auto-X series of NMR probes, commercially available from Varian, Inc, Palo Alto, Calif. The utility of such prior art is established by identifying these relative discrete capacitances with the gyromagnetic ratio of selected nuclei. The present method can be implemented by providing a switchable capacitance to achieve resonance at the discrete center frequency for the respective micro mode operation(s).

It should be observed that conventional NMR probes often comprise a plurality of RF resonators such as represented by resonator 48. Thus, a first RF resonator 48 may be coaxially disposed within another RF resonator 48' (not shown) conventionally available for decoupling operations, or the like. These conventional RF resonators 48 and 48' will ordinarily be so disposed to exhibit orthogonality of their respective RF magnetic fields. For such a probe, the insertion of the micro-coil 50 may be so relatively oriented to obtain maximum inductive coupling to one of the "macro" resonator/coils 48 or 48' with minimal inductive coupling to the other coil 48' or 48. Such arrangement is preferred to enable the widest choice of experiments, such as indirect detection. Whether the conventional probe comprises a single, or plural resonators, it is an important requirement that the micro-coil 50 take on a desired azimuthal orientation of its RF magnetic field with respect to that of one RF resonator 48 (or the other, of plural resonators).

Mechanical support of the micro-coil 50 is preferably independent of the support of the micro-sample container. An exemplary embodiment is shown in FIGS. 3a, 3b, 3c and 3d. The micro-coil axis is coaxial with that of the coil 48. It is understood that the resonators 48, 48' are fixed in respect of the NMR probe housing and represent conventional structure. The micro-coil is directly supported on the outer surface of former 94, in turn suspended from bushing 96. An outer tube 95' is shown as typically employed for the confinement of an axially directed heating gas passing over the sample region for temperature regulation.

The probe bushing 96 is recognized by those of skill in the art as the mechanical equivalent of a spinner body, or turbine, for conventional sample spinning and/or for simply securing and aligning a sample container on the axis of a probe coil. The probe bushing 96 is, more generally an alignment bushing that (in a preferred embodiment) supports a micro-coil 50 and secures coaxial alignment of micro-coil 50 and the sample container 88 with respect to the probe housing. The probe bushing 96 is readily insert-able and removable from the housing of the probe to facilitate transition between conventional utilization of the probe (macro mode operation). In the preferred embodiment, the sample container is similarly readily insert-able and removable from the probe bushing 96. When inserted in the probe housing, the probe bushing 96 conveniently is supported by the (conventional provided) cup shaped air bearing base, or equivalent surface, of such conventional arrangement of the probe housing in order to secure axial alignment of the probe bushing 96 with the fixed resonator(s) 48-48'. Other convenient arrangements for securing coaxial alignment with the probe housing will be apparent to those of skill in the art. In micro-coil operation, it is understood that the micro-coil 50 is arranged to orient the $B_1$ field direction of the micro-coil to a desired azimuthal direction. Particular experiments (indirect detection, for example) utilize two resonators 48 and 48' and require the orthogonality of the $B_1$ (RF magnetic) field of one respective resonator, e.g., 48' with that of micro-coil 50. Separately, there will be dependence of the coupling strength of the resonator 48 for excitation of micro-coil 50 to excite the self-resonance of micro-coil 50. Reduction of this inductive (excitation) coupling, by azimuthal displacement of the micro-coil 50, will lower the necessary frequency range of the RF resonator without attenuation of acquired signal strength, provided that the matched impedance condition is maintained. As a practical matter, such reduction of the required frequency range is not great: and, such angular displacement of the micro-coil 50 will compromise desired isolation from another resonator 48'. It is conventional that a typical probe will orient these resonators to exhibit orthogonal respective RF fields. The desired orientation of the micro-coil 50 in respect to fixed resonators 48, 48' is secured by index 92 as for example a pin protruding radially from probe bushing 96 for engagement with the probe housing in any convenient manner.

Figure 3B:
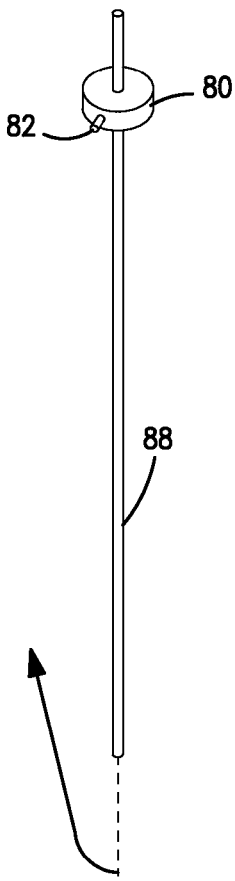
FIG. 3b is the insertable micro-sample tube.

FIG. 3b illustrates the sample insertion assembly which provides for the insertion/removal of a micro-sample container 88 independently of the micro-coil 50. A sample bushing 80 is received in a conformal cavity on the upper surface of probe bushing 96 to obtain the appropriate coaxial alignment of the sample container with the resonator 48. As shown in FIG. 3b, the sample container is a cylindrical tube and therefore requires no particular azimuthal orientation for a cylindrical cross section sample container. The sample container may take on other cross sectional forms as disclosed in U.S. Pat. No. 6,917,201, and U.S. Pat. No. 7,557,578. In such cases, the sample insertion subassembly resembles that shown in FIG. 4b in order to obtain the desired azimuthal alignment with respect to the RF magnetic field directions of resonator 48 and micro-coil 50.

Figure 3C:
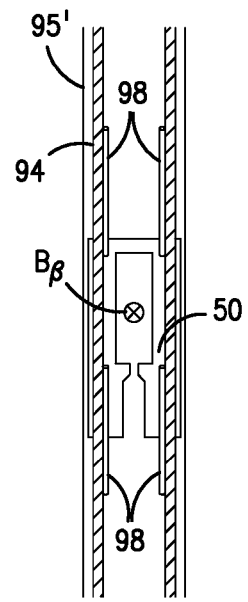
Figure 3D:
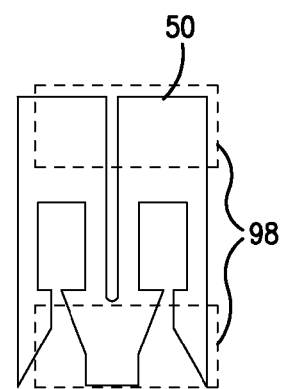
FIG. 3d is a micro-coil and RF shields mapped onto a plane.
Figures 5A, 5B, 5C:
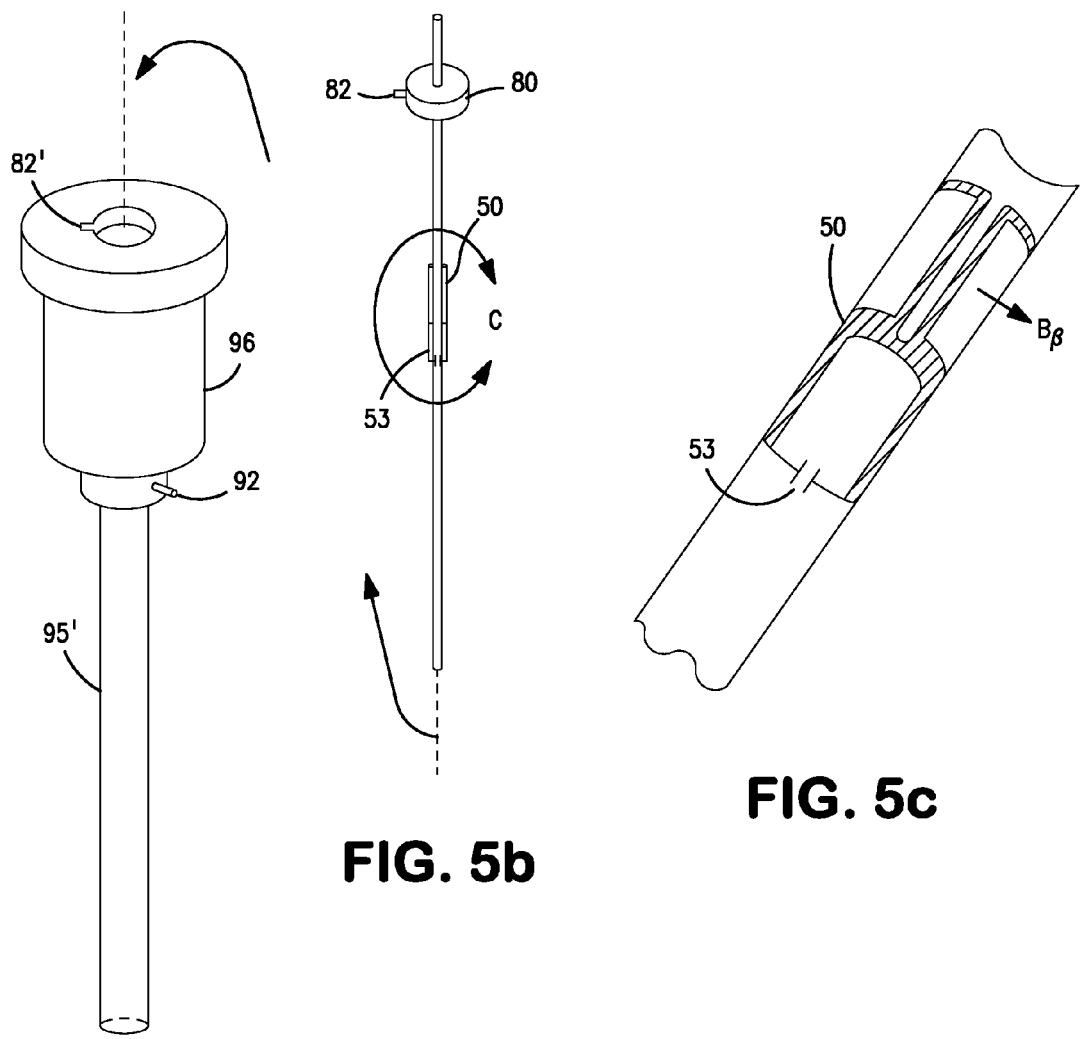
FIGS. 5a, 5b and 5c show another sample holder incorporating a micro-resonant circuit.

Floating RF shields 98 are supported on an inner surface of the former 94 (by way of example) and serve the dual purpose of defining the RF ($B_1$) aperture, or window, for the micro-coil 50 and also providing the capacitance of the self resonant micro-coil circuit. Floating shields deployed for this purpose are well known. See U.S. Pat. No. 6,008,650, commonly assigned herewith. In FIG. 3D a micro-coil 50 is shown in a planar mapping with RF shields 98 (the latter displaced from the coil by thickness of coil former 94).

Independent support of the micro-coil 50, as shown in FIG. 3B for example, permits convenient transition between macro-mode and micro-mode of operation without disturbing the probe body and its attendant signal/power cables, gas connections for (macro-mode spinning or for thermal regulation), and the like. Modern analytical NMR apparatus is nearly universal in employment of a vertical symmetry axis for installation of the NMR probe within the bore of the NMR magnet. The above description allows for insertion and removal of the micro-coil 50 from above the probe body and the independent insertion and removal of a sample container from the micro-coil. Moreover the insertion/removal operations conveniently occur above the magnet bore. This arrangement facilitates rapid alternation between operational modes as may be desired, as well as alternation between a number of samples. In particular, this arrangement lends itself to automated operation as conventionally realized with robot arm apparatus operating upon a queue of samples subject to diverse experiments. Such automated robot arm apparatus is common in the art, as for example, Sample Management System (SMS) or the equivalent, available from Varian Inc, Palo Alto, Calif.

In another embodiment illustrated in FIGS. 4a and 4b, the micro-coil 50 is supported on a separate former 86 in turn supported on the outer surface of the micro sample container 88. It is well known to formulate the requisite materials to maintain magnetic homogeneity of the space by magnetic susceptibility matching of such materials to the magnetic environment. For this embodiment, the micro-coil 50 is preferably supported on a thin-walled sleeve 86 of fused silica or the like, which in turn, is directly supported on the micro sample container 88. The inner surface of the fused silica sleeve 86 supports the floating RF shields (shown as 98 in FIG. 3c) which define the RF aperture for irradiation of sample and supply capacitance to the micro-coil self resonant circuit 50'. The micro-coil 50 and the shields 87 may be integral with the sleeve 86 using common deposition techniques. The sleeve is of sufficient length to extend well beyond the sensitive region of the NMR instrument, (well beyond the RF apertures of the resonator 48, 48' and micro-coil 50) where an appropriate adhesive, or equivalent, may be applied to secure the axial position of the micro-coil 50. In order to secure azimuthal orientation index, the micro-sample tube orientation bushing 80 may secure a desired orientation via radial orientation pin 82 received into a slot 82' in the top surface of probe bushing 96'. In this embodiment, self-resonant circuit 50' is inserted/removed together as a unit with the micro sample container 88.

In a variation on the embodiment of FIGS. 4a, 4b, FIGS. 5a, 5b, and 5c feature the incorporation of the micro-coil 50 as integral to the (micro) sample container 88. The micro-coil 50 is preferably deposited directly on the outer surface of the micro sample container 88, obviating the need for a separate coil former. The capacitance 53 completing the self resonant circuit 50' is supplied at some remove from the active region of the micro-coil 50. This is shown schematically in FIG. 5b where the capacitance is supplied from chip capacitors or from specially constructed distributed capacitance. As shown, the floating RF shields of the previously discussed embodiments are here omitted. However, it is possible to supply functional floating RF shields (as shown in the embodiment of FIG. 3c) on a deposited conductive layer covered by a deposited dielectric layer upon which the micro-coil is deposited. For assembly of the micro sample assembly of this embodiment, care is given to the relative orientation of the radial orientation pin 82 with respect to micro coil 50. This embodiment obtains maximum filling factor for micro mode operation.

It will be observed that the present work places no limitation on the topography of a resonator 48 or the micro-coil 50. The RF magnetic field directions of the respective coils (48, 50) may be orthogonal (as desired for indirect detection and like experiments where a second probe coil 48' is available for excitation). The RF resonator should be coaxial for maximum coupling between non-solenoidal coils (48, 48', 50). Coaxial coils (48, 48' and 50), take the form of saddle coils, birdcage coils, and the like, where the RF magnetic field is transverse to the geometric axis of the coil which most often coincides with the bore of the polarizing magnet of the NMR instrument. Solenoidal coils, for which the RF magnetic field direction coincides with the geometric axis, are less common, but may be employed as one or another of the coils used in the present work. The RF resonator 48 may also take the form of a resonant cavity. The coaxial property facilitates insertion and removal of the micro-coil 50. The relative orientations of the external polarizing field, and the respective RF magnetic field directions $B_1$, $B_1'$ of the resonator (48, 48') and the RF field $B_\beta$ of micro-coil 50 are critical to the particular NMR experiment.

It will be understood that various details of the invention may be changed without departing from the scope of the invention. Furthermore, the foregoing description is for the purpose of illustration only, and not for the purpose of limitation—the invention being defined by the claims.

What is claimed is:

1. A method of use of an NMR probe in a first operating mode to achieve optimized sensitivity at a resonance frequency $\omega_0$ for a first sample quantity, and subsequently operating in a second operating mode to achieve optimized sensitivity at the same resonant frequency $\omega_0$ for a second sample quantity, the second sample quantity much smaller than the first sample quantity, the method comprising:
   providing an NMR probe having an RF resonator optimized for studies of said first sample quantity, wherein the RF resonator provides an RF magnetic field along a first direction;
   inserting the first sample quantity of a first sample into said probe;
   supplying RF energy at frequency $\omega_0$;
   tuning the NMR probe to $\omega_0$ and acquiring first desired data therefrom, whereby operation in the first operating mode is fulfilled;
   removing said first sample from the probe;
   inserting a self resonant micro-coil within said RF resonator;
   inserting a micro sample along the axis of the self resonant micro-coil, said micro-coil surrounding said micro sample, said micro-coil inductively coupled to the RF resonator;
   re-tuning the NMR probe to a frequency $\omega c > \omega_0$, and the frequency $\omega c$ sufficient to excite self-resonance of the micro-coil at $\omega_0$;
   inserting the second sample quantity into the RF resonator of the NMR probe; and
   acquiring second desired data from the micro sample, whereby said second operating mode is fulfilled.

2. The method of claim 1, wherein the step of inserting comprises supporting the micro coil on a micro sample container, said micro sample container containing said second sample.

3. The method of claim 1, further comprising removing of the micro-coil from the RF resonator, and retuning the RF resonator to $\omega_0$, thereby restoring the first operating mode.

4. The method of claim 2, comprising the step of aligning the RF field of the micro coil to coincide with the RF field of the RF resonator.

5. The method of claim 1, wherein said resonator comprises a circuit including a reactance connected to an RF coil, said RF coil coaxially surrounding said micro-coil and the step of re-tuning comprises switching an alternate reactance into the circuit of resonator to modify said resonance frequency from a range of frequency including $\omega_0$ to a range of frequency including $\omega c$.

6. The method of claim 1, wherein the step of inserting comprises supporting a micro sample container independently from said micro-coil, said micro sample container containing said second sample.

7. The method of claim 1, wherein said step of inserting comprises orienting said micro-coil to exhibit an RF magnetic field along a desired orientation in respect of the RF magnetic field of the RF resonator.

8. The method of claim 6, wherein said steps of inserting and removing are accomplished by a robot arm.

9. An NMR probe for alternate investigations at optimum conditions of selected samples comprising different selected sample volumes in sample containers of respective different cross-sectional dimension, comprising:
   a probe housing supporting at least one RF resonator, the RF resonator capable of resonant operation at frequency $\omega_0$, the RF resonator having a principal RF magnetic field direction $B_1$, said RF resonator having generally cylindrical symmetry about an axis z;
   a removable micro-coil support assembly comprising:
      a probe bushing dimensioned to be readily received by, and removable from said probe housing, a self resonant circuit comprising a micro-coil, the self resonant circuit being resonant at frequency $\omega_0$ and the micro-coil having a principal RF magnetic field direction $B_\beta$ and said micro coil disposed coaxially with said RF resonator upon receipt within said probe housing, said probe bushing comprising a first azimuthal index in respect to the direction $B_1$ whereby to establish a desired relative orientation of the direction $B_\beta$ with the direction $B_1$: and
   a sample assembly comprising a sample bushing, and an elongate sample container having an axis of symmetry, said sample bushing having an aperture configured to receive the sample container and mutually align said symmetry axes of the sample assembly and the micro-coil, said probe bushing configured to readily receive the sample bushing.

10. The NMR probe of claim 9, wherein the sample assembly is integral with the probe bushing.

11. The NMR probe of claim 10, wherein the micro-coil is supported by the sample container.

12. The NMR probe of claim 9, wherein the sample assembly is readily received by and removable from sample bushing and the micro-coil is supported by the sample container and sample bushing comprises a second azimuthal orientation index comprising slot and pin to assure the desired relative orientation of the direction $B_\beta$ with the direction $B_1$.

13. The NMR probe of claim 9, wherein sample container has a non-circular cross-section and the sample bushing comprises a sample assembly azimuthal orientation index to align the non-circular cross section in desired relationship with the direction $B_\beta$.

* * * * *